United States Patent
Sato et al.

(10) Patent No.: US 12,143,027 B2
(45) Date of Patent: Nov. 12, 2024

(54) INVERTER STRUCTURE

(71) Applicants: Mazda Motor Corporation, Aki-gun (JP); Rohm Co., Ltd., Kyoto (JP)

(72) Inventors: Takayuki Sato, Aki-gun (JP); Masashi Hayashiguchi, Kyoto (JP)

(73) Assignees: MAZDA MOTOR CORPORATION, Hiroshima (JP); ROHM CO., LTD., Kyoto (JP)

( * ) Notice: Subject to any disclaimer, the term of this patent is extended or adjusted under 35 U.S.C. 154(b) by 152 days.

(21) Appl. No.: 17/970,338

(22) Filed: Oct. 20, 2022

(65) Prior Publication Data

US 2023/0179111 A1 Jun. 8, 2023

(30) Foreign Application Priority Data

Oct. 29, 2021 (JP) ................. 2021-178162

(51) Int. Cl.
*H02M 7/00* (2006.01)
*H02M 7/539* (2006.01)

(52) U.S. Cl.
CPC ........... *H02M 7/003* (2013.01); *H02M 7/539* (2013.01)

(58) Field of Classification Search
CPC ..... H02M 7/003; H02M 7/539; H02M 7/5387
See application file for complete search history.

(56) References Cited

U.S. PATENT DOCUMENTS

| | | | |
|---|---|---|---|
| 6,160,696 A | 12/2000 | Bailey et al. | |
| 2008/0049476 A1* | 2/2008 | Azuma | B60L 50/61 361/699 |
| 2011/0205724 A1* | 8/2011 | Nakajima | B60K 6/48 361/809 |
| 2014/0140034 A1 | 5/2014 | Kusada et al. | |
| 2016/0307822 A1 | 10/2016 | Usui et al. | |
| 2018/0146577 A1 | 5/2018 | Ide et al. | |
| 2019/0115849 A1 | 4/2019 | Götz | |
| 2020/0395868 A1 | 12/2020 | Kashiwazaki et al. | |
| 2021/0143746 A1 | 5/2021 | Aoyagi et al. | |
| 2023/0021288 A1 | 1/2023 | Nishimachi | |
| 2023/0136232 A1 | 5/2023 | Sato et al. | |
| 2023/0179111 A1 | 6/2023 | Sato et al. | |

FOREIGN PATENT DOCUMENTS

| | | |
|---|---|---|
| CN | 205809148 U | 12/2016 |
| EP | 1788596 A1 | 5/2007 |
| EP | 3352362 A1 | 7/2018 |

(Continued)

*Primary Examiner* — Jue Zhang
*Assistant Examiner* — Afework S Demisse
(74) *Attorney, Agent, or Firm* — Alleman Hall & Tuttle LLP

(57) ABSTRACT

In an inverter that includes a smoothing capacitor and a plurality of power modules, the smoothing capacitor includes a plurality of columnar unit capacitors each having electrodes at both ends thereof, a one-end-side bus plate connected to the electrode at one end of each unit capacitor, and an other-end-side bus plate connected to the electrode at the other end of the unit capacitor. The unit capacitors are arranged, with axes thereof parallel to each other, side by side in a direction perpendicular to the axes. The power modules are arranged at positions equally distant from a center of the inverter and equally distant from the smoothing capacitor.

20 Claims, 15 Drawing Sheets

(56) References Cited

FOREIGN PATENT DOCUMENTS

| | | |
|---|---:|---|
| EP | 3651342 A1 | 5/2020 |
| JP | 2004274992 A | 9/2004 |
| JP | 2008061282 A | 3/2008 |
| JP | 2013220029 A | 10/2013 |
| JP | 2017188998 A | 10/2017 |
| KR | 20100011033 A | 2/2010 |

\* cited by examiner

INVERTER STRUCTURE

BACKGROUND OF THE INVENTION

1. Field of the Invention

The present disclosure relates to a structure of an inverter device mounted on electric vehicles, such as electric automobiles and hybrid automobiles.

2. Description of the Related Art

Inverters are known which convert direct current to alternating current. The inverters include power modules including switching elements.

Since an inverter of this type deals with a large amount of power, a high voltage is applied and large current flows in the inverter. The inverter requires cooling because it generates a large amount of heat when activated. A large surge voltage also occurs. Individual electronic components of the inverter, therefore, tend to be large in size and weight. The presence of such an inverter of the related art has been a hindrance to achieving better fuel economy and lower power consumption.

To shorten the distance of power transmission, an inverter is typically disposed near a drive motor. Since an automobile requires many components to be installed, the space for accommodating the inverter is limited. The balance of the vehicle body also needs to be considered. Therefore, it is difficult to properly position a large size, heavy weight inverter in the automobile.

As an inverter structure in an alternating current motor combined with an inverter, for example, a structure is known where a positive (+) bus bar and a negative (−) bus bar are molded of resin as an integral part of a doughnut-shaped inverter case, and are connected to a switching element (see, e.g., Japanese Unexamined Patent Application Publication No. 2004-274992).

An inverter includes, for example, power modules including switching elements, and a smoothing capacitor. Generally, such electronic components of an inverter that supports a high-voltage power supply are large in size and weight, as described above.

Metal strips (bus bars), which are electronic components for connecting the power modules and the smoothing capacitor described above, also allow large current to flow therein and thus are large in size and weight. As the wiring length of bus bars increases, the electric resistance also increases and this results in copper loss when current flows. The bus bars generate a large amount of heat. Moreover, since large current in the inverter is switched on and off at high speed by switching control, significant magnetic changes occur in the bus bars.

When the inverter is activated, the magnetic changes cause noise, vibration, and electromagnetic interference in the bus bars. This leads to energy loss and negatively affects the performance of the automobile in various ways. Necessary measures need to be taken to avoid this. If the bus bars have a complex shape, the resulting impact is more significant.

In the technique described in Japanese Unexamined Patent Application Publication No. 2004-274992, the switching element and the smoothing capacitor are connected through the positive bus bar and the negative bus bar that are molded of resin as an integral part of the inverter case. With this configuration, due to constraints in wiring length and width, it is not easy to equalize the inductances of the bus bars while reducing them.

SUMMARY OF THE INVENTION

The present invention has been made in view of the points described above. An object of the present invention is to facilitate equalization of the inductances of wires connected to the smoothing capacitor while reducing the inductances.

To achieve the object described above, a first aspect of the present invention provides an inverter structure of an inverter including a smoothing capacitor and a plurality of power modules. The smoothing capacitor includes a plurality of columnar unit capacitors each having electrodes at both ends thereof, a plate-shaped one-end-side bus plate connected to the electrode at one end of each unit capacitor, and a plate-shaped other-end-side bus plate connected to the electrode at the other end of the unit capacitor. The unit capacitors are arranged, with axes thereof parallel to each other, side by side in a direction along a plane perpendicular to the axes. The power modules are arranged at positions equally distant from a predetermined center of the inverter and equally distant from the smoothing capacitor.

The unit capacitors are arranged, with axes thereof parallel to each other, side by side in a direction along a plane perpendicular to the axes. This can reduce the size of the inverter in the axial direction. The smoothing capacitor includes the plate-shaped one-end-side bus plate and the plate-shaped other-end-side bus plate that are connected to the electrodes at one end and the other end of each unit capacitor. The power modules can thus be easily arranged in such a way as to reduce the distance to the smoothing capacitor. That is, the degree of freedom in the layout of the power modules can be improved. The power modules are arranged at positions equally distant from a predetermined center of the inverter and equally distant from the smoothing capacitor. This can further reduce the size of the inverter in the axial direction. It is also possible to reduce inductance because of the reduced distance between the smoothing capacitor and the power modules, easily equalize the inductances because of the uniform distance between each power module and the smoothing capacitor, and offer greater control over the motor.

A second aspect of the present invention is characterized in that in the inverter structure according to the first aspect of the present invention, a pattern of arrangement of each of the power modules and at least some unit capacitors close to the power module is set to be constant.

The power modules are thus equally positioned with respect to their corresponding unit capacitors, and this further facilitates equalization of inductances.

A third aspect of the present invention is characterized in that in the inverter structure according to the first or second aspect of the present invention, the one-end-side bus plate and the other-end-side bus plate are circular in outer shape.

This allows, for example, extension and connection of terminals at any position in the circumferential direction of the smoothing capacitor, and thus can easily increase the degree of freedom in the layout of the power modules.

A fourth aspect of the present invention is characterized in that in the inverter structure according to any one of the first to third aspects of the present invention, the inverter further includes an input bus bar configured to connect one of an outer edge of the one-end-side bus plate and an outer edge of the other-end-side bus plate to the power modules.

A fifth aspect of the present invention is characterized in that in the inverter structure according to any one of the first to third aspects of the present invention, an outer edge of at least one of the one-end-side bus plate and the other-end-side bus plate is connected to the power modules.

It is thus possible to facilitate connection of the smoothing capacitor to the power modules while reducing and equalizing inductances.

A sixth aspect of the present invention is characterized in that in the inverter structure according to any one of the first to fifth aspects of the present invention, an outer surface of at least one of the one-end-side bus plate and the other-end-side bus plate is disposed in the same plane as one of outer surfaces of the power modules.

This further facilitates size reduction in the axial direction of the inverter.

The present disclosure can facilitate equalization of inductances of wires connected to the smoothing capacitor.

DESCRIPTION OF THE PREFERRED EMBODIMENTS

Figure 1:
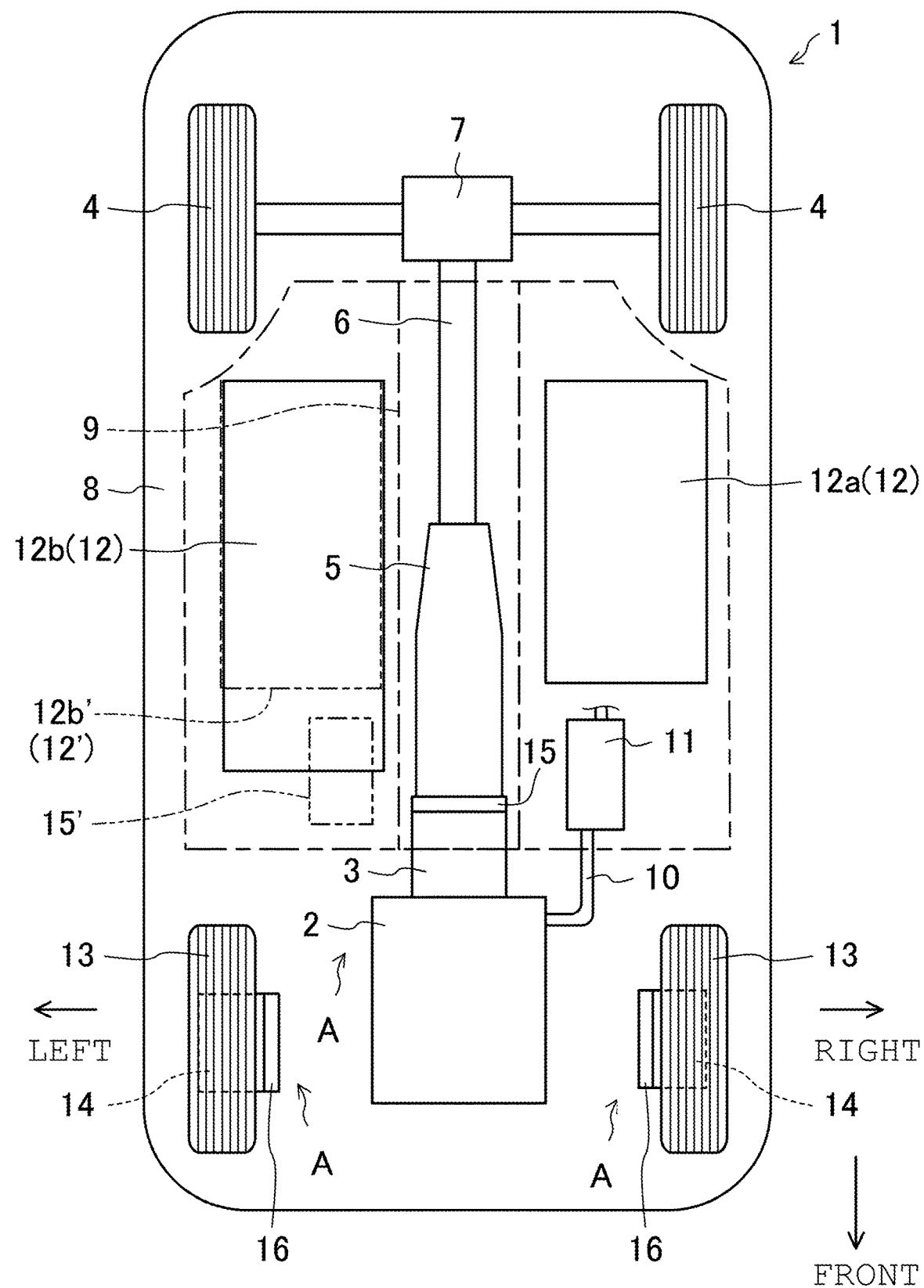
FIG. 1 is a diagram schematically illustrating a configuration of a vehicle system including drive units according to a first embodiment.

Hereinafter, embodiments of the present invention will be described in detail on the basis of the drawings. The following description of preferred embodiments is merely illustrative in nature and is in no way intended to limit the present invention, its application, or uses. In the embodiments and modifications described below, components having the same functions as those of the other embodiments or modifications are assigned the same reference numerals and their description will be omitted.

First Embodiment (Vehicle Configuration)

FIG. 1 illustrates a vehicle 1 including drive units A according to a first embodiment, as viewed from below the vehicle 1. The vehicle 1 transmits power from at least one of an engine 2 and a drive motor 3 disposed at the front of the vehicle 1 to rear wheels 4 disposed at the rear of the vehicle 1. That is, the vehicle 1 is a front-engine, rear-wheel drive (FR) hybrid vehicle.

As illustrated in FIG. 1, the vehicle 1 includes the engine 2, a transmission 5 coupled to the engine 2, a drive motor 3 interposed between the engine 2 and the transmission 5, a propeller shaft 6 coupled to the transmission 5 and configured to transmit power from the engine 2 and the drive motor 3 to the rear wheels 4, and a differential gear 7 coupled to the propeller shaft 6 and configured to transmit power from the engine 2 and the drive motor 3 to the rear wheels 4 on the right and left sides.

The propeller shaft 6 extends in the vehicle front-rear direction on the underside of a floor panel 8. A tunnel 9 is provided in the center of the floor panel 8 in the vehicle width direction. The propeller shaft 6 is disposed inside the tunnel 9.

The vehicle 1 includes an exhaust pipe 10 that extends from the engine 2 in the vehicle front-rear direction. A catalytic device 11 is disposed on the upstream side of the exhaust pipe 10. While not shown, a silencer is disposed on the downstream side of the exhaust pipe 10.

The vehicle 1 includes a fuel tank (not shown) that stores fuel to be supplied to the engine 2, and a battery 12 that stores power to be supplied to the motor 3. The drive motor 3 transmits power to the rear wheels 4. During deceleration of the vehicle 1, the drive motor 3 generates regenerative power by being rotationally driven by the propeller shaft 6, and supplies the generated power to the battery 12. The battery 12 is composed of a first battery unit 12a and a second battery unit 12b arranged on both sides in the vehicle width direction. The second battery unit 12b is longer than the first battery unit 12a in the vehicle front-rear direction. The battery units 12a and 12b each include a plurality of battery cells. The battery cells are, for example, lithium-ion batteries.

An in-wheel motor 14 is connected to each of front wheels 13 on the right and left sides. The in-wheel motors 14 function as assist motors that generate power at the start of the vehicle 1 and transmit the power to the front wheels 13. The in-wheel motors 14 also function as regenerative brakes that generate power during deceleration of the vehicle 1. Like the drive motor 3, the in-wheel motors 14 are supplied with power from the battery 12.

As illustrated in FIG. 1, an inverter 15 is interposed between the drive motor 3 and the transmission 5. The drive motor 3 and the inverter 15 are arranged adjacent to each other in the axial direction of the drive motor 3 (or in the vehicle front-rear direction). An inverter 16 is disposed inside each of the in-wheel motors 14 in the vehicle width direction. The in-wheel motor 14 and the inverter 16 are arranged adjacent to each other in the axial direction of the in-wheel motor 14 (or in the vehicle width direction). The drive motor 3 and the inverter 15 constitute a drive unit A. Similarly, the in-wheel motor 14 and the inverter 16 constitute a drive unit A.

The inverters 15 and 16 convert direct-current power stored in the battery 12 to alternating-current power and supply the alternating-current power to the motors 3 and 14. During deceleration of the vehicle 1, the inverters 15 and 16 convert alternating-current power generated by the motors 3 and 14 to direct-current power and charge the battery 20.

(Drive Unit)

Figure 2:
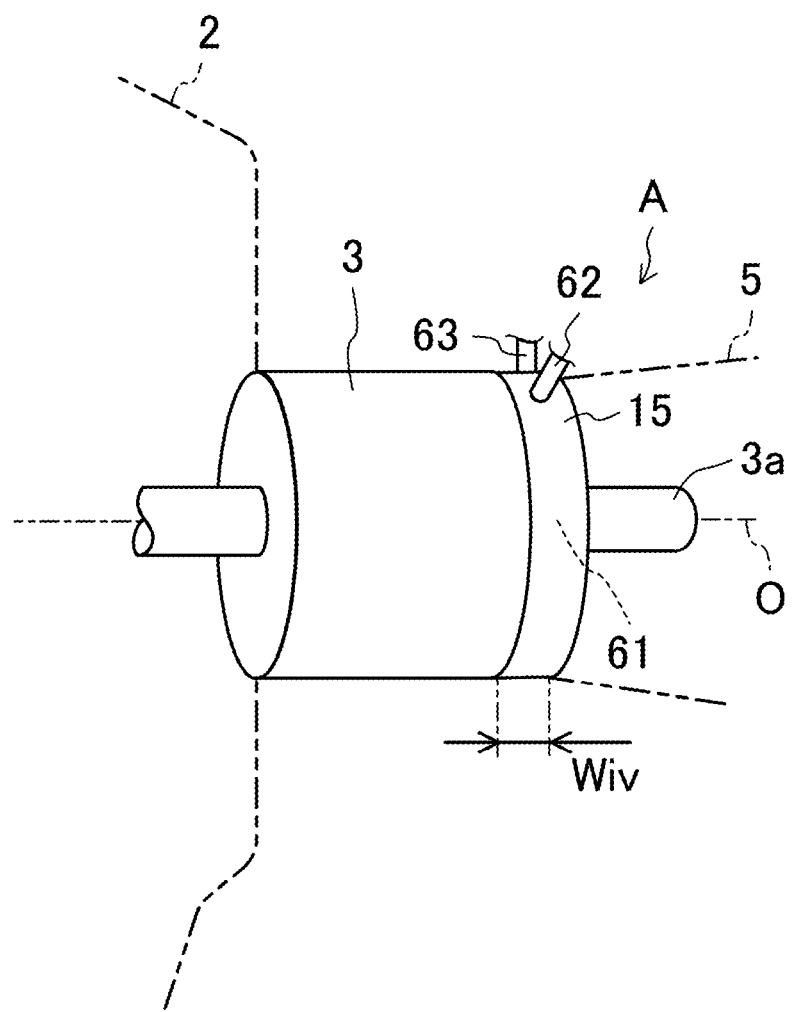
FIG. 2 is a perspective view of a drive unit including a motor and an inverter.

The drive unit A of the vehicle 1 will be described by using one that includes the drive motor 3 and the inverter 15 as an example. FIG. 2 is a perspective view of the drive unit A. As described above, the drive unit A is constituted by the motor 3 and the inverter 15. The motor 3 and the inverter 15 are coaxially arranged adjacent to each other in the axial direction of the motor 3. Specifically, a central axis O of the motor 3 coincides with a central axis O of the inverter 15. The motor 3 (specifically, a casing of the motor 3) is cylindrically shaped. The inverter 15 (specifically, a casing of the inverter 15) is cylindrically shaped to fit the motor 3. A rotary shaft 3$a$ of the motor 3 penetrates the inverter 15 in the axial direction. The inverter 15 is a thin member that has, for example, a thickness Wiv of 50 mm or less (preferably 30 mm or less). The inverter 15 has an internal cooling passage 61 (described below). An inlet pipe 62 and an outlet pipe 63 for cooling are connected to the upper part of the inverter 15 and communicate with the cooling passage 61.

Figure 3:
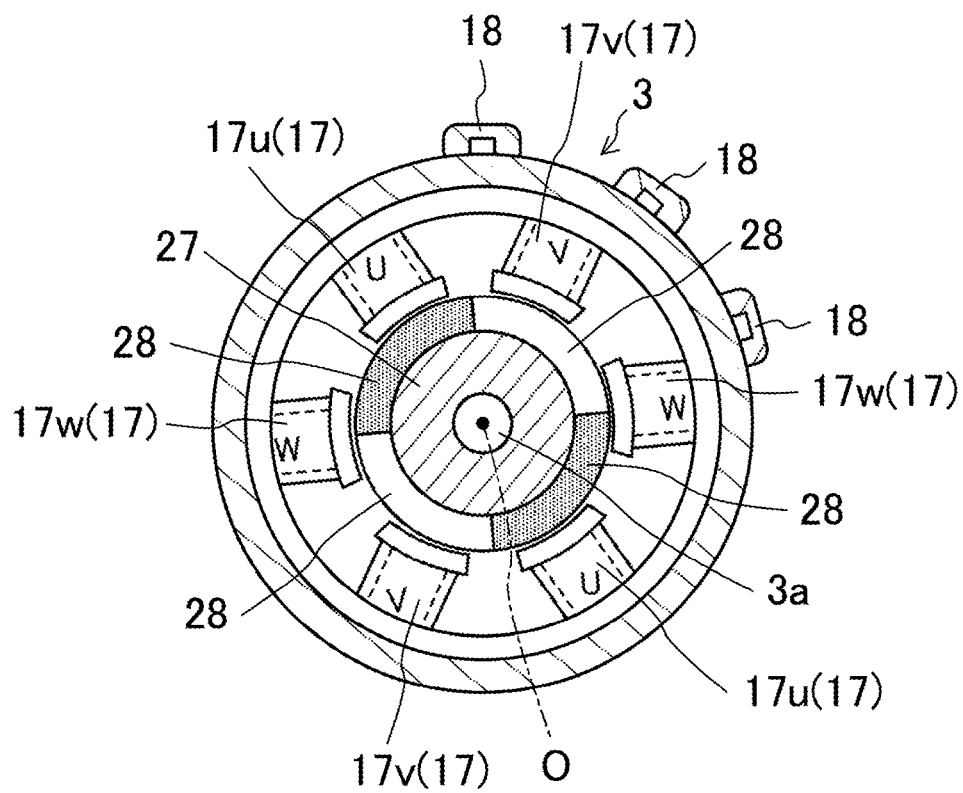
FIG. 3 is a horizontal cross-sectional view of the motor, as viewed from the inverter.

FIG. 3 is a horizontal cross-sectional view of the motor 3, as viewed from the inverter 15. The motor 3 includes coils 17. Specifically, U-phase, V-phase, and W-phase coils 17$u$, 17$v$, and 17$w$ are each formed by concentrated winding on the stator of the motor 3. Two U-phase coils 17$u$ are arranged opposite each other in the radial direction of the motor 3. Similarly, two V-phase coils 17$v$ are arranged opposite each other in the radial direction of the motor 3. Similarly, two W-phase coils 17$w$ are arranged opposite each other in the radial direction of the motor 3.

The motor 3 has three motor-side terminal blocks 18 on the outer periphery thereof. The three motor-side terminal blocks 18 correspond to the U-phase, V-phase, and W-phase coils 17$u$, 17$v$, and 17$w$. A lead wire (not shown) is extended from each of the two U-phase coils 17$u$. The two lead wires are tied into a bundle and connected to the corresponding one of the motor-side terminal blocks 18. The same applies to the V-phase coil 17$v$ and the W-phase coil 17$w$. An iron core 27 and N-pole and S-pole permanent magnets 28, which constitute a rotor, are secured to the rotary shaft 3$a$.

Figure 4:
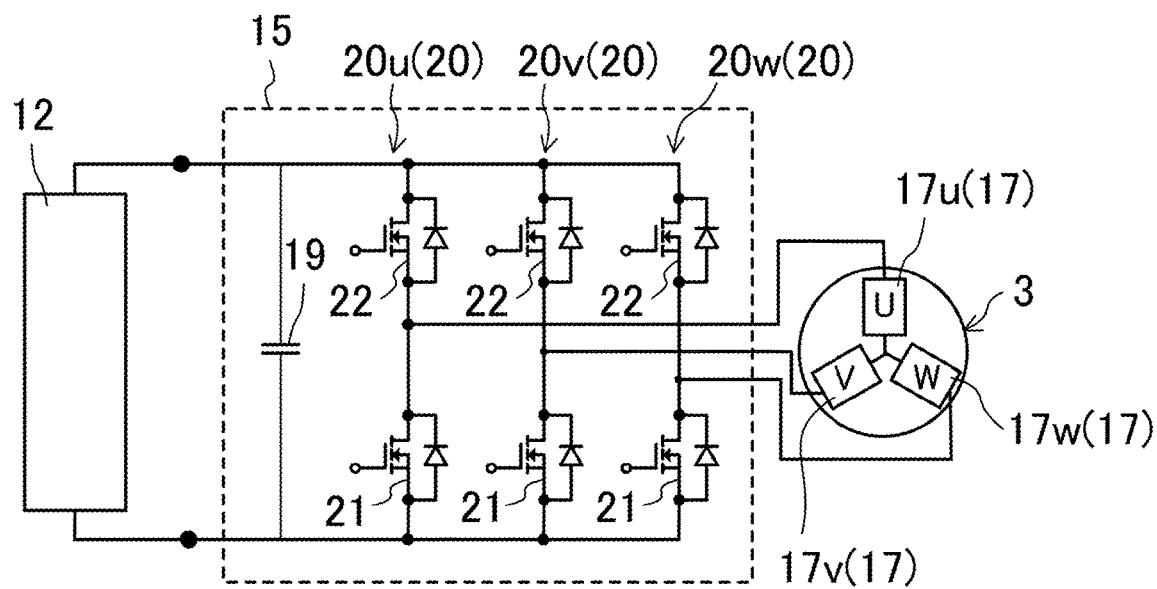
FIG. 4 is a circuit diagram of the inverter.

FIG. 4 is a circuit diagram of the inverter 15. The inverter 15 includes a smoothing capacitor 19 and a plurality of power modules 20. The smoothing capacitor 19 smooths a voltage applied to the power modules 20. The plurality of power modules 20 constitute an inverter circuit and convert a direct-current voltage to an alternating-current voltage.

The plurality of power modules 20 include a U-phase power module 20$u$, a V-phase power module 20$v$, and a W-phase power module 20$w$. The U-phase power module 20$u$ is connected to the U-phase coil 17$u$ of the motor 3. The V-phase power module 20$v$ is connected to the V-phase coil 17$v$ of the motor 3. The W-phase power module 20$w$ is connected to the W-phase coil 17$w$ of the motor 3.

The power modules 20 are each composed of two arm elements, a lower arm element 21 and an upper arm element 22, each serving as a switching element. When one of the lower arm element 21 and the upper arm element 22 opens in the power module 20 of each phase, the other of the lower arm element 21 and the upper arm element 22 closes. This allows three-phase alternating current to be supplied to the motor 3.

Figure 5:
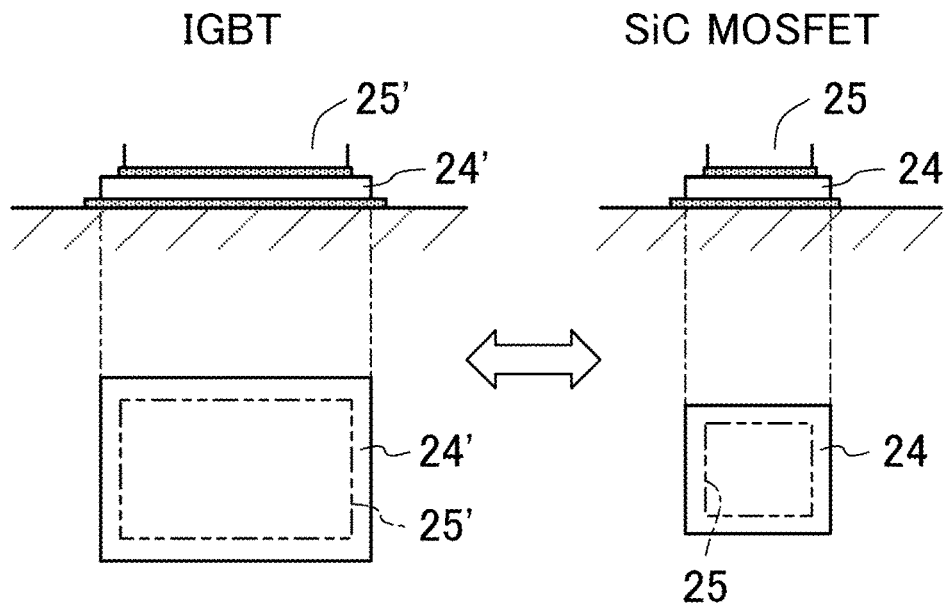
FIG. 5 compares a SiC-MOSFET and an IGBT.

The power module 20 includes a metal-oxide-semiconductor field-effect transistor (MOSFET) containing silicon carbide (SiC) (hereinafter referred to as SiC-MOSFET). FIG. 5 compares a SiC-MOSFET and an insulated gate bipolar transistor (IGBT). The SiC-MOSFET constitutes a chip 24 including the lower arm element 21, the upper arm element 22, and other control elements. The lower surface of the chip 24 is secured by soldering to a silicon substrate. A copper block 25 serving as a heat transfer block is secured by soldering to the upper surface of the chip 24. The same applies to the IGBT.

As illustrated in FIG. 5, the surface area of the chip 24 constituted by the SiC-MOSFET is smaller than the surface area of a chip 24' constituted by the IGBT. Accordingly, the size of the copper block 25 disposed on the upper side of the SiC-MOSFET (chip) 24 is smaller than the size of a copper block 25' disposed on the upper side of the IGBT (chip) 24'. The SiC-MOSFET has better heat resistance than the IGBT.

Figure 6:
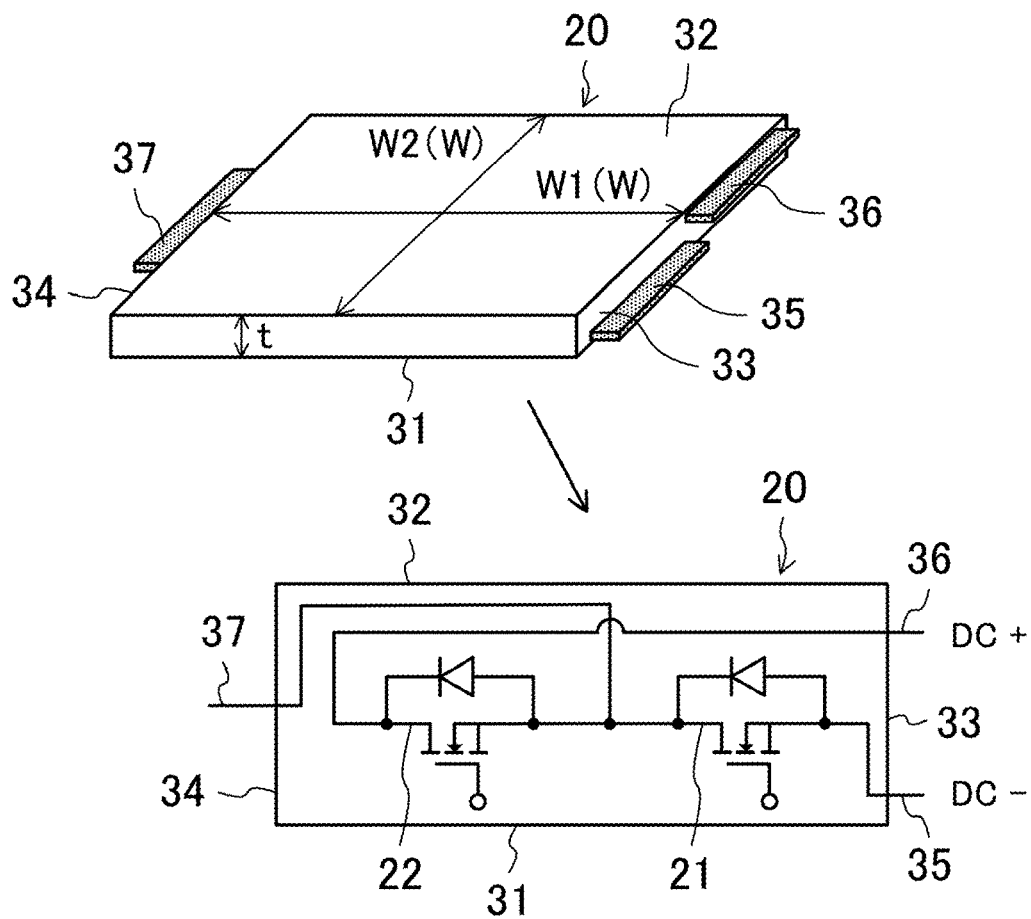
FIG. 6 gives a perspective view and a circuit diagram illustrating a detailed structure of a power module.

FIG. 6 gives a perspective view and a circuit diagram illustrating a detailed structure of the power module 20. Each power module 20 has a wide flat shape. Specifically, each power module 20 is longer in a width direction W than in a thickness direction t. The power module 20 is substantially in the shape of a rectangular parallelepiped. The width direction W includes a first width direction W1 and a second width direction W2 orthogonal to each other. Hereinafter, one side of the power module 20 in the thickness direction t may be referred to as a lower side, and the other side of the power module 20 in the thickness direction t may be referred to as an upper side.

The power module 20 has a lower surface 31 to be cooled (first cooled surface), on the lower side thereof (or on one side thereof in the thickness direction t). The power module 20 has an upper surface 32 on the upper side thereof. The power module 20 has a first end face 33 on one side thereof in the first width direction W1. The power module 20 has a second end face 34 on the other side thereof in the first width direction W1.

A negative-side input terminal 35 is connected to the lower side of the first end face 33, on one side of the first end face 33 in the second width direction W2. A positive-side input terminal 36 is connected to the upper side of the first end face 33, on the other side of the first end face 33 in the second width direction W2. The negative-side input terminal 35 and the positive-side input terminal 36 are spaced apart in the up and down direction (thickness direction t). An output terminal 37 is connected to the center of the second end face 34.

The lower arm element 21 and the upper arm element 22 are housed in a package (housing) of the power module 20. The negative-side input terminal 35 is connected to the lower arm element 21, and the positive-side input terminal 36 is connected to the upper arm element 22. The output terminal 37 is connected between the lower arm element 21 and the upper arm element 22.

Figure 7:
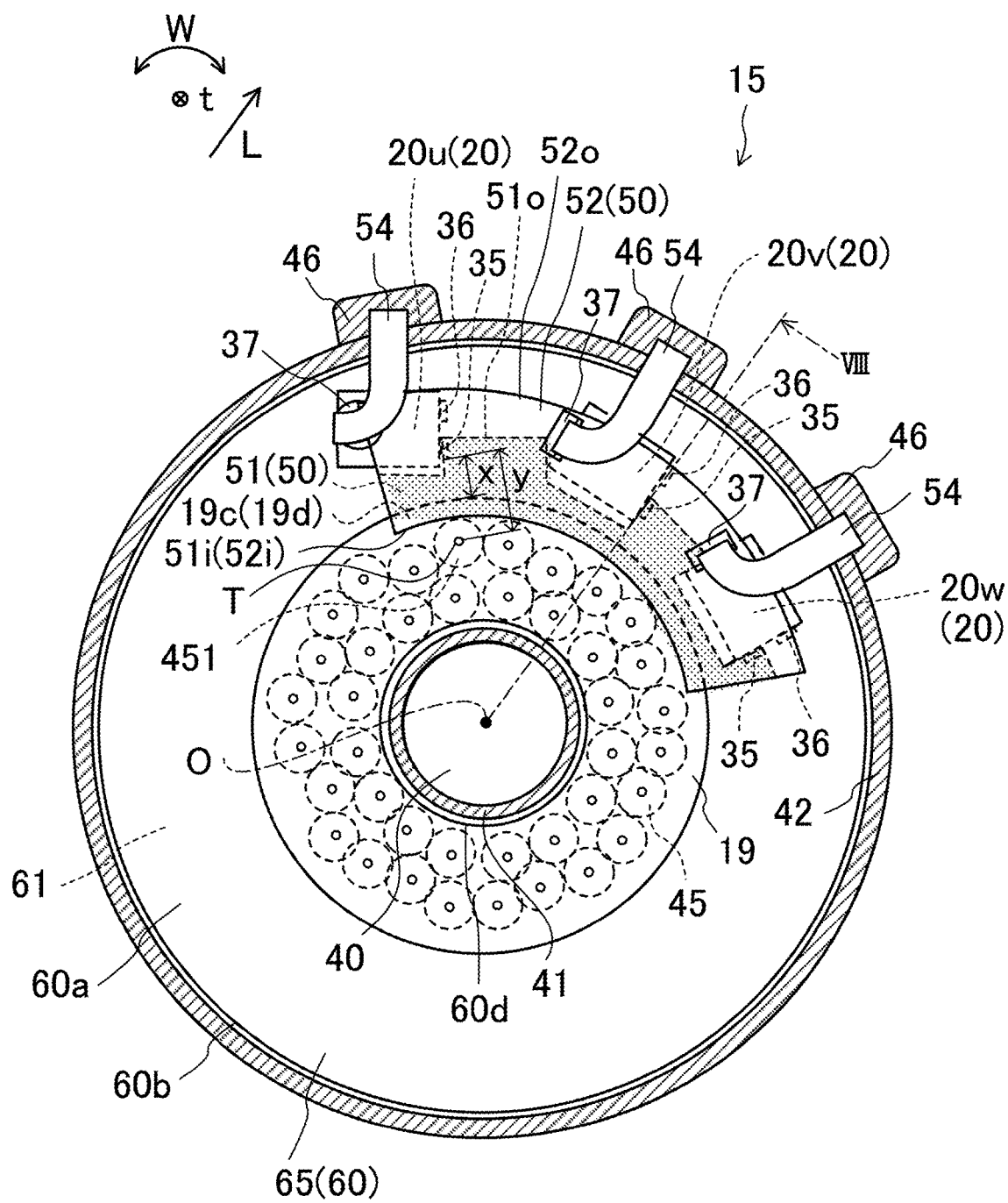
FIG. 7 is a horizontal cross-sectional view of the inverter, as viewed from the side opposite the motor.
Figure 8:
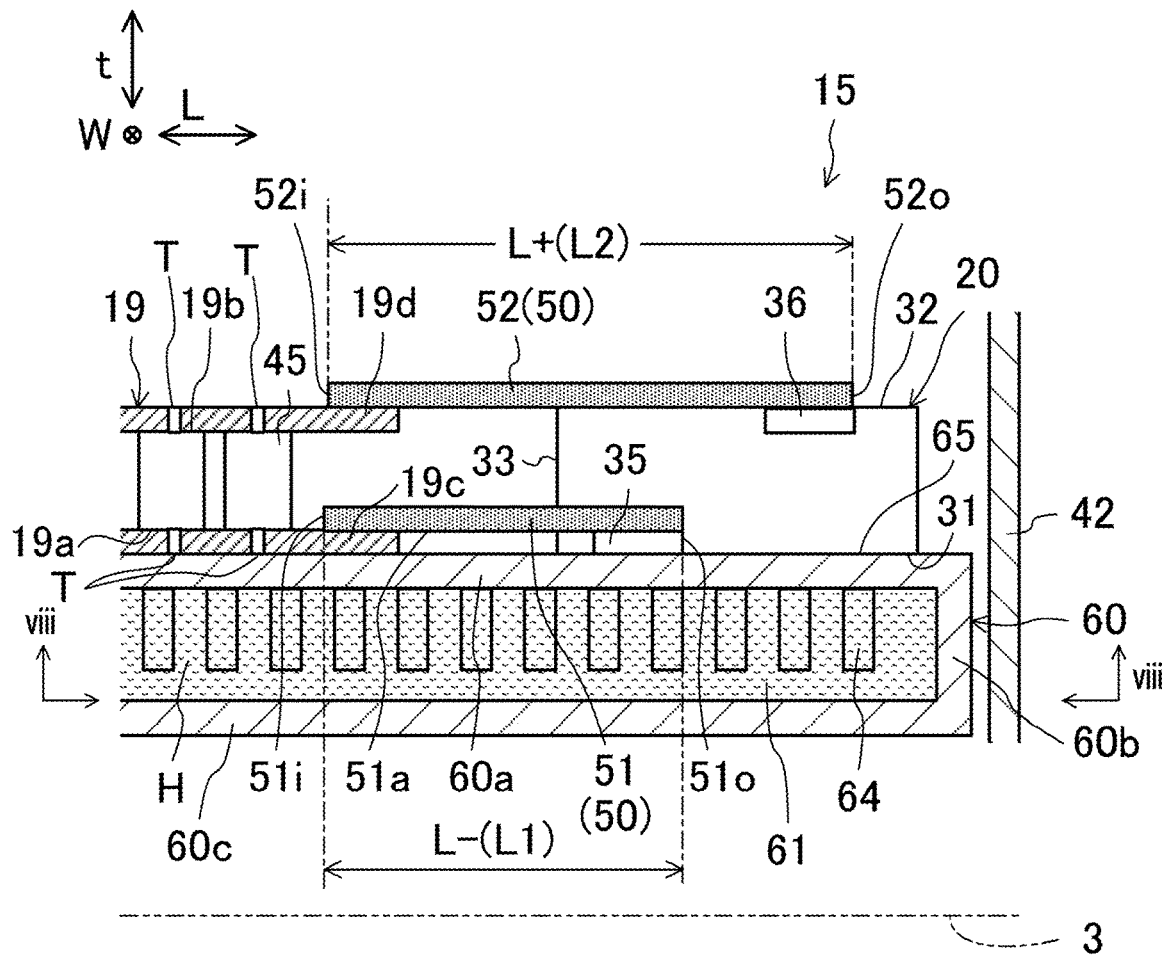
FIG. 8 is a vertical cross-sectional view of the inverter.

FIG. 7 is a horizontal cross-sectional view of the inverter 15, as viewed from the side opposite the motor 3. FIG. 8 is a vertical cross-sectional view taken along line VIII-VIII in the inverter 15 illustrated in FIG. 7. As illustrated in FIG. 7, the inverter 15 has, in the center thereof, a shaft through-hole 40 that allows the rotary shaft 3$a$ of the motor 3 to pass therethrough. The shaft through-hole 40 is defined by a cylindrical boss 41 formed therearound. The smoothing capacitor 19 is disposed along the boss 41.

The power modules 20 (U-phase power module 20u, V-phase power module 20v, and W-phase power module 20w) are arranged on the outer side of the smoothing capacitor 19. The power modules 20 are arranged side by side in the circumferential direction of the motor 3, on the outer side of the smoothing capacitor 19. That is, for example, the power modules 20 are arranged at positions (on a circular arc) equally distant from the center of the rotary shaft 3a of the motor 3. At the same time, the power modules 20 are arranged at positions equally distant from the smoothing capacitor 19 (i.e., positions in respective radial directions of the smoothing capacitor 19). More specifically, for example, when x is the distance between the negative-side input terminal 35 (or positive-side input terminal 36) of the U-phase power module 20u and the outer edge of the one-end-side bus plate 19c (or the other-end-side bus plate 19d) of the smoothing capacitor 19, the same distance x is set for the V-phase power module 20v and the W-phase power module 20w. The distance between only one of the negative-side input terminal 35 and the positive-side input terminal 36 and the smoothing capacitor 19, described above, may be equal for all the power modules 20.

The input terminals 35 and 36 (on the first end face 33) and the output terminal 37 (on the second end face 34) of each power module 20 are configured to face in the circumferential direction of the motor 3 (inverter 15). The power modules 20 are arranged on respective lines radially extending from the center O of the inverter 15 (motor 3). The power modules 20 are each disposed in such a way that the thickness direction t coincides with the axial direction of the motor 3. The smoothing capacitor 19 and the power modules 20 are arranged in a space defined by an outer peripheral wall 42 and the boss 41 in the inverter 15.

As illustrated in FIGS. 7 and 8, a heat sink 60 is disposed on a side of the inverter 15 adjacent to the motor 3. The heat sink 60 is mainly used for cooling the power modules 20. The heat sink 60 is disposed between the outer peripheral wall 42 and the boss 41 in the inverter 15. The heat sink 60 has an upper wall 60a, an outer peripheral wall 60b, a lower wall 60c, and an inner peripheral wall 60d.

An upper surface 65 of the upper wall 60a of the heat sink 60 constitutes a mounting surface (which may hereinafter be referred to as "mounting surface 65") orthogonal to the axial direction of the motor 3. The lower surface (first cooled surface) 31 of each of the power modules 20 (U-phase power module 20u, V-phase power module 20v, and W-phase power module 20w) faces toward the motor 3. Specifically, the lower surfaces (first cooled surfaces) 31 of the power modules 20 are arranged side by side on the same mounting surface 65.

As illustrated in FIGS. 7 and 8, the smoothing capacitor 19 is formed by a group of columnar unit capacitors 45 each having electrodes T at both ends (one end 19a and the other end 19b) thereof. The columnar unit capacitors 45 are arranged, with axes thereof parallel to each other (i.e., parallel to the rotary shaft 3a of the motor 3), side by side in a direction along a plane perpendicular to the axes, and connected together by being held from both sides in the axial direction by the one-end-side bus plate 19c and the other-end-side bus plate 19d that are circular in outer shape. The one-end-side bus plate 19c on the lower side of the smoothing capacitor 19 serves as a surface to be cooled (third cooled surface) and faces toward the motor 3. Specifically, the one-end-side bus plate 19c of the smoothing capacitor 19 is mounted on the mounting surface 65.

The configuration of the electrodes T at the one end 19a and the other end 19b of each unit capacitor 45 is not particularly limited, and electrodes of various types may be used. For example, the electrodes T may be lead wire electrodes, band electrodes, or plate-shaped electrodes. Also, the way of connecting the electrodes T to the one-end-side bus plate 19c and the other-end-side bus plate 19d is not particularly limited, and various techniques, such as welding, soldering, or mechanical pressure bonding, may be used.

The plurality of unit capacitors 45 are arranged in such a way that some of them are equally distant, for example, from the center of the rotary shaft 3a of the motor 3. Also, a pattern of arrangement of each of the power modules 20 and at least some unit capacitors 45 close to the power module 20 is set to be constant. Additionally or alternatively, the distance between each power module 20 and at least the unit capacitor 45 closest to the power module 20 is set to be constant. More specifically, for example, when y is the distance between the negative-side input terminal 35 (or positive-side input terminal 36) of the U-phase power module 20u and the electrode T of a unit capacitor 451 closest thereto, the same distance y is set for the V-phase power module 20v and the W-phase power module 20w. The distance between only one of the negative-side input terminal 35 and the positive-side input terminal 36 and the unit capacitor 45 closest thereto may be equal for all the power modules 20.

With the configuration described above, the inductances of connecting wires between the smoothing capacitor 19 and the power modules 20 can be easily reduced, and/or the inductances described above can be easily equalized by making the power modules 20 equally distant from the smoothing capacitor 19.

As illustrated in FIGS. 7 and 8, with respect to the smoothing capacitor 19, the power modules 20 are arranged side by side in a direction along a plane perpendicular to the axial direction. The smoothing capacitor 19 is connected to the power modules 20 by a negative-side bus bar 51 and a positive-side bus bar 52 serving as input bus bars 50 (which may hereinafter be simply referred to as "bus bars 50"). The negative-side bus bar 51 and the positive-side bus bar 52 are plate-shaped. Specifically, the negative-side bus bar 51 and the positive-side bus bar 52 are longer in the width direction W and the length direction L than in the thickness direction t.

As illustrated in FIG. 7, the negative-side bus bar 51 and the positive-side bus bar 52 are wide members that extend along the circumferential direction of the motor 3 (inverter 15). In other words, the negative-side bus bar 51 and the positive-side bus bar 52 are wide members that extend along the direction in which the power modules 20 are arranged side by side. The width direction W of the negative-side bus bar 51 and the positive-side bus bar 52 is along the circumferential direction of the motor 3 (or along an arc). The negative-side bus bar 51 and the positive-side bus bar 52 are fan-shaped. The length direction L of the negative-side bus bar 51 and the positive-side bus bar 52 is along the radial direction of the motor 3.

The negative-side bus bar 51 is connected at one end portion 51i thereof to the outer edge of the one-end-side bus plate 19c on the lower side of the smoothing capacitor 19. The negative-side bus bar 51 is also connected at the other end portion 51o thereof to the negative-side input terminal 35 of each power module 20. The positive-side bus bar 52 is connected at one end portion 52i thereof to the outer edge of the other-end-side bus plate 19d on the upper side of the smoothing capacitor 19. The positive-side bus bar 52 is also connected at the other end portion 52o thereof to the positive-side input terminal 36 of each power module 20. The outer edge of at least one of the one-end-side bus plate 19c and the other-end-side bus plate 19d may be directly connected to the negative-side input terminal 35 or the positive-side input terminal 36 of the power module 20.

The negative-side bus bar 51 may have a lower surface 51a to be cooled (second cooled surface), on the lower side thereof (or on one side thereof in the thickness direction t). The lower surface (second cooled surface) 51a of the negative-side bus bar 51 faces toward the motor 3. Specifically, the lower surface (second cooled surface) 51a of the negative-side bus bar 51 may be mounted on the mounting surface 65.

As illustrated in FIG. 7, an output bus bar 54 is connected to the output terminal 37 of each power module 20. There are a total of three output bus bars 54 corresponding to the U-phase, the V-phase, and the W-phase. The output bus bars 54 are each interposed between the power module 20 and a corresponding one of the coils 17. The output bus bar 54 is plate-shaped. In addition to the output bus bar 54, a wire harness may be interposed between the power module 20 and a corresponding one of the coils 17.

The inverter 15 has three inverter-side terminal blocks 46 on the outer periphery thereof. The inverter-side terminal blocks 46 correspond to the respective power modules 20. The output bus bars 54 each extend to a corresponding one of the inverter-side terminal blocks 46. Electrically conducting members (such as a bus bar and a wire harness) are interposed between each inverter-side terminal block 46 and a corresponding one of the motor-side terminal blocks 18.

(Inductance Sensitivity of Bus Bar)

Figure 9:
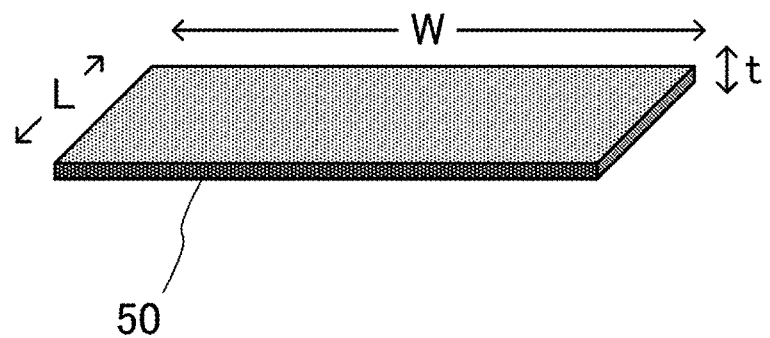
FIG. 9 is a perspective view of a bus bar.
Figure 10:
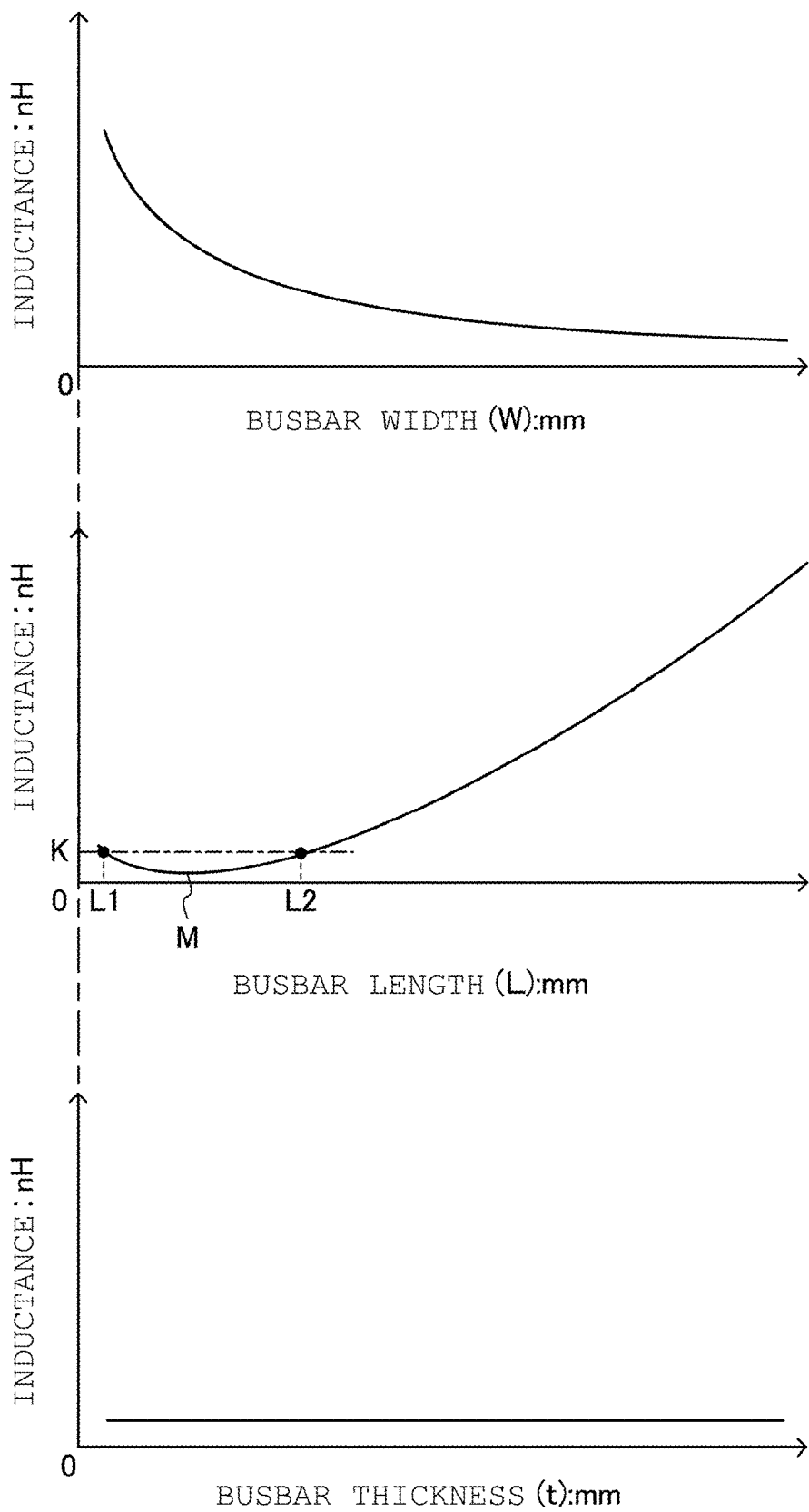
FIG. 10 gives graphs each illustrating a relation between a bus bar size and inductance sensitivity.

FIG. 9 is a perspective view of the bus bar 50. FIG. 10 gives graphs each illustrating a relation between a size of the bus bar 50 and inductance sensitivity. As a result of dedicated studies, the inventors of the present application made the following discoveries about the relation between the size of the bus bar 50 and inductance sensitivity.

As illustrated in FIGS. 9 and 10, the inductance sensitivity (nH) of the bus bar 50 decreases as the width dimension W (mm) of the bus bar 50 increases.

Basically, the inductance sensitivity (nH) of the bus bar 50 increases as the length dimension L (mm) of the bus bar 50 increases. However, as shown by the graph in the middle of FIG. 10, the relation between the length dimension L (mm) and the inductance sensitivity (nH) of the bus bar 50 has a local minimum M. This means that different length dimensions L correspond to the same inductance sensitivity (nH). Specifically, the inductance sensitivity (nH) of the bus bar 50 (51 or 52) is a function of the length dimension L (mm) from the one end portion 51i or 52i (i.e., the one-end-side bus plate 19c or other-end-side bus plate 19d of the smoothing capacitor 19) to the other end portion 51o or 52o (i.e., the input terminal 35 or 36 of each power module 20) of the bus bar 50 (51 or 52). The function has the local minimum M such that different lengths, the first length L1 (mm) and the second length L2 (mm), correspond to the same inductance sensitivity K (nH). The second length L2 (mm) is longer than the first length L1 (mm).

The inductance sensitivity (nH) of the bus bar 50 shows little change with the change in the thickness dimension t (mm) of the bus bar 50.

As illustrated in FIG. 7, the width dimension of the negative-side bus bar 51 and the width dimension of the positive-side bus bar 52 are substantially the same. As illustrated in FIG. 8, the length dimension L− of the negative-side bus bar 51 and the length dimension L+ of the positive-side bus bar 52 differ from each other. The length dimension L− of the negative-side bus bar 51 corresponds to the first length L1. The length dimension L+ of the positive-side bus bar 52 corresponds to the second length L2. The length dimension L+ of the positive-side bus bar 52 (second length L2) is longer than the length dimension L− of the negative-side bus bar 51 (first length L1). Because of the presence of the local minimum M, however, the inductance of the negative-side bus bar 51 and the inductance of the positive-side bus bar 52 are equal.

(Cooling Passage)

Figure 11:
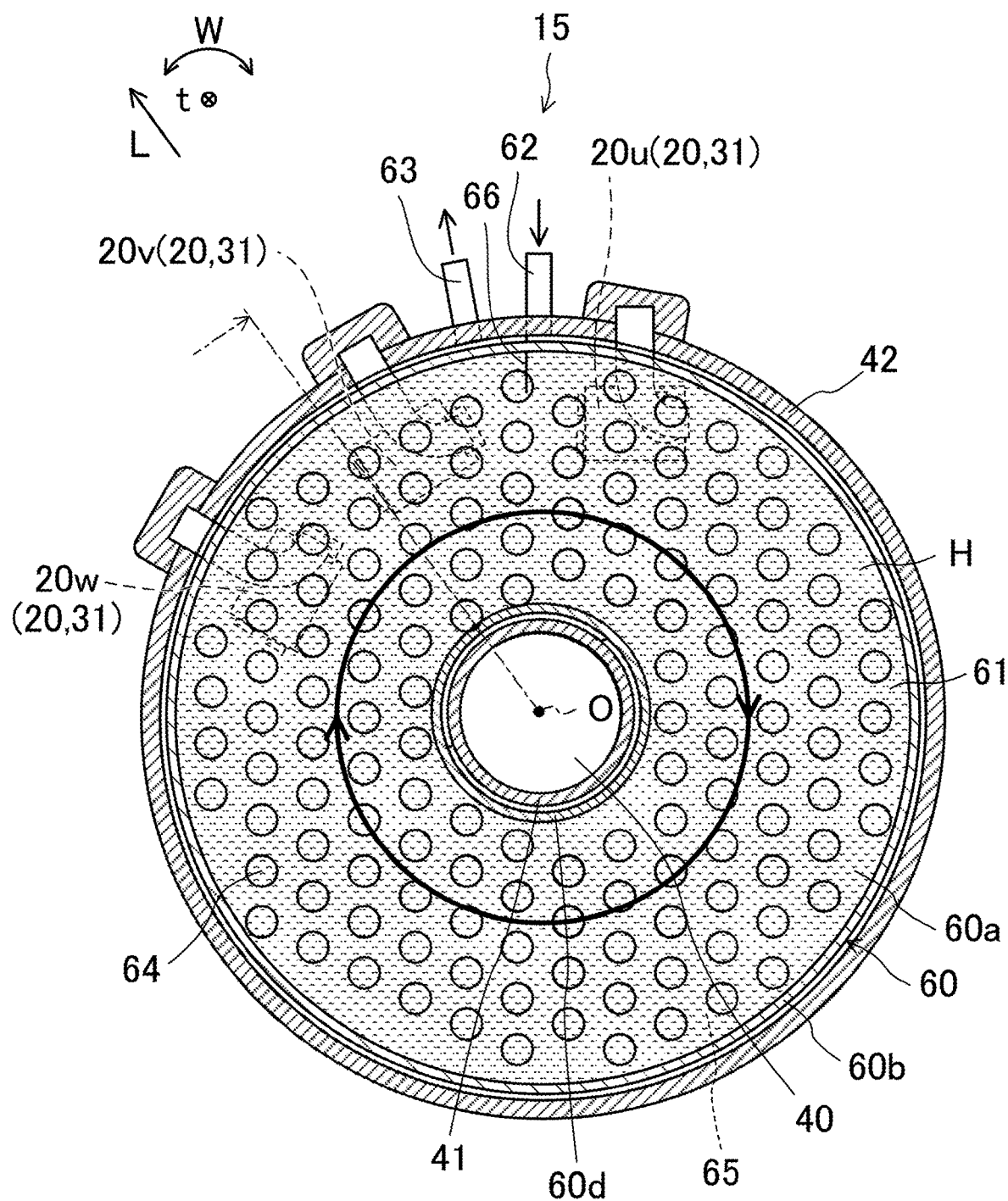
FIG. 11 is a horizontal cross-sectional view of a cooling passage in the inverter, as viewed from the motor.

FIG. 11 is a horizontal cross-sectional view of the cooling passage 61 in the inverter 15, as viewed from the motor 3. As illustrated in FIGS. 8 and 11, the heat sink 60 has therein the cooling passage (cooling jacket) 61 constituting a cooling zone. The cooling passage 61 is defined by the upper wall 60a, the outer peripheral wall 60b, the lower wall 60c, and the inner peripheral wall 60d. As viewed in the axial direction of the motor 3 (inverter 15), the cooling passage 61 is a doughnut-shaped (annular or cylindrical) passage that extends throughout the perimeter. The rotary shaft 3a of the motor 3 penetrates inside the inner peripheral wall 60d. As described above, the upper surface of the upper wall 60a of the heat sink 60 is the mounting surface 65.

The cooling passage 61 is disposed closer to the motor 3 than the mounting surface 65 is. A cooling medium H flows in the cooling passage 61. For example, the cooling medium H is cooling water or cooling oil.

A plurality of fins 64 constituting the cooling zone are provided in the interior (cooling passage 61) of the heat sink 60. In the cooling passage 61, the fins 64 extend downward from the upper wall 60a. That is, the fins 64 are disposed closer to the motor 3 than the mounting surface 65 is.

As illustrated in FIGS. 8 and 11, as viewed in the axial direction of the motor 3 (inverter 15), the cooling passage (cooling zone) 61 faces toward the entire area of both the lower surface (first cooled surface) 31 of each power module 20 and the one-end-side bus plate (third cooled surface) 19c on the lower side of the smoothing capacitor 19.

Similarly, as viewed in the axial direction of the motor 3, the fins (cooling zone) 64 face toward the entire area of both the lower surface (first cooled surface) 31 of each power module 20 and the one-end-side bus plate (third cooled surface) 19c on the lower side of the smoothing capacitor 19.

As illustrated in FIG. 11, the inlet pipe 62 and the outlet pipe 63 are connected to the upper part of the outer peripheral wall 42 of the inverter 15. The inlet pipe 62 and the outlet pipe 63 communicate with the cooling passage 61. The cooling medium H introduced through the inlet pipe 62 into the cooling passage 61 is guided by the outer peripheral wall 42 and the boss 41 to circumferentially flow in the cooling passage 61, and is then discharged through the outlet pipe 63 to the outside. The inlet pipe 62 may be provided with a guide plate 66 on the downstream side.

(Operation and Effect of First Embodiment: Reduced and Equalized Inductances)

In the present embodiment, increasing the width dimensions of the bus bars 51 and 52 can reduce the inductances of the bus bars 51 and 52.

The smoothing capacitor 19 and the power modules 20u, 20v, and 20w are mounted on the same mounting surface 65. Since this reduces the lengths of the bus bars 51 and 52 that connect the smoothing capacitor 19 to the power modules 20u, 20v, and 20w, the inductances of the bus bars 51 and 52 can be reduced.

The motor 3 and the inverter 15 are arranged adjacent to each other in the axial direction. This reduces the length of an electric path between each of the power modules 20u, 20v, and 20w and a corresponding one of the coils 17u, 17v, and 17w. It is thus possible to reduce the inductance of the electric path (including the output bus bar 54) that connects each of the power modules 20u, 20v, and 20w to a corresponding one of the coils 17u, 17v, and 17w.

The power modules 20u, 20v, and 20w are arranged side by side in the circumferential direction of the motor 3, on the outer side of the smoothing capacitor 19. This can equalize the distances between the smoothing capacitor 19 and each of the power modules 20u, 20v, and 20w. With the bus bars 51 and 52 that are wide members extending along the circumferential direction of the motor 3, the inductances of the electric paths between the smoothing capacitor 19 and each of the power modules 20u, 20v, and 20w can be equalized.

With the local minimum M (see FIG. 10), even though the length dimension L− of the negative-side bus bar 51 (first length L1) and the length dimension L+ of the positive-side bus bar 52 (second length L2) differ from each other, the inductance of the negative-side bus bar 51 and the inductance of the positive-side bus bar 52 can be equalized.

As described above, a pattern of arrangement of each power module 20 and some unit capacitors 45 close to the power module 20 is set to be constant. Also, the distance between each power module 20 and at least the unit capacitor 45 closest to the power module 20 (i.e., the distance of wiring connection between the electrode and the terminal) is set to be constant. Thus, the inductances of the connecting wires between the smoothing capacitor 19 and the power modules 20 can be more easily reduced, and/or the inductances described above can be easily equalized by making the power modules 20 equally distant from the smoothing capacitor 19.

(Operation and Effect of First Embodiment: Improved Cooling Performance)

In each power module 20 having a wide and flat shape, the lower surface (first cooled surface) 31 having a large area faces toward the cooling passage 61 and the fins 64 constituting a cooling zone. This increases the area of the power modules 20 cooled by the cooling passage 61 and fins 64 (cooling zone). Thus, even when only one side (lower surface, first cooled surface) 31 of the power module 20 is cooled by the cooling passage 61 and fins 64 (cooling zone), it is possible to ensure sufficient cooling performance.

The lower surfaces (first cooled surfaces) 31 of the power modules 20 (U-phase power module 20u, V-phase power module 20v, and W-phase power module 20w) are arranged side by side on the same mounting surface 65 orthogonal to the axial direction of the motor 3. This can reduce the axial length of the inverter 15. Also, since the cooling passage 61 and fins 64 (cooling zone) simply need to be provided on one side (lower surfaces, first cooled surfaces) 31 of the power modules 20, the inverter 15 can be made smaller than when the cooling passage 61 and fins 64 (cooling zone) are provided on both sides of the power modules 20.

With the configuration described above, it is possible to reduce the size of the drive unit A composed of the motor 3 and the inverter 15 while sufficiently cooling the power modules 20.

By allowing the cooling medium H to flow in the cooling passage 61 constituting a cooling zone, the power modules 20 can be more effectively cooled by the cooling zone.

Since the SiC-MOSFET chip 24 included in each power module 20 is small in size, the copper block 25 (heat transfer block) disposed on the SiC-MOSFET chip 24 is also small in size (see FIG. 5). To enable the power module 20 to be effectively cooled on both sides, it is necessary to provide expensive ceramic substrates (e.g., SiN substrates) on both sides of the SiC-MOSFET chip 24. Cooling one side of the power module 20 and improving the effectiveness of cooling the one side is more advantageous costwise than cooling both sides of the power module 20.

Together with the power modules 20, the smoothing capacitor 19 can also be cooled by the cooling passage 61 and fins 64 (cooling zone).

The power modules 20 are arranged side by side in the circumferential direction of the motor 3, on the outer side of the smoothing capacitor 19. At the same time, by extending the negative-side bus bar 51 in the circumferential direction of the motor 3, the negative-side bus bar 51 can be easily widened in the width direction W. This can easily increase the area of heat dissipation from the negative-side bus bar 51 toward the cooling passage 61 and fins 64 (cooling zone).

The cooling passage 61 and fins 64 (cooling zone) are disposed adjacent to the motor 3. This is also advantageous for cooling the wires (e.g., output bus bars 54) that connect the motor 3 to the power modules 20.

In the related art, as indicated by a two-dot chain line in FIG. 1, an inverter 15' has often been disposed near a second battery unit 12b' of a battery 12'. In the present embodiment, where the inverter 15 can be disposed adjacent to the motor 3 in the axial direction, the inverter 15 does not need to be disposed near the second battery unit 12b. This can increase the degree of freedom in the layout of the second battery unit 12b and can increase the size of the second battery unit 12b.

First Modification of First Embodiment

Figure 12:
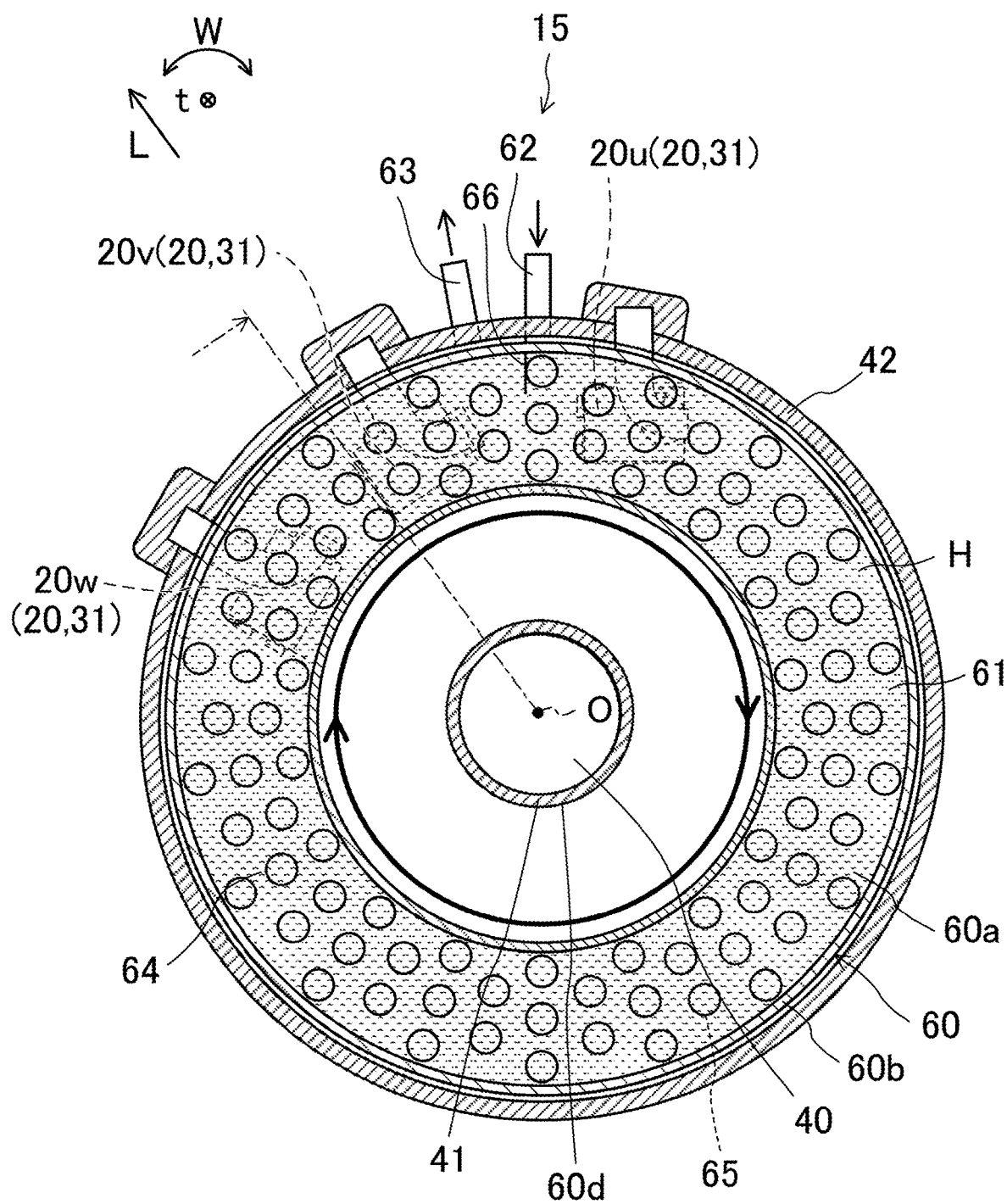
FIG. 12 is a horizontal cross-sectional view corresponding to FIG. 11 and illustrating the cooling passage in the inverter, as viewed from the motor, according to a first modification of the first embodiment.

FIG. 12 corresponds to FIG. 11 and illustrates a first modification of the first embodiment. In the present modification, the cooling passage 61 and fins 64 (cooling zone) do not at all face toward the one-end-side bus plate (third cooled surface) 19c on the lower side of the smoothing capacitor 19.

There may be no problem even when the smoothing capacitor 19, which generates less heat than the power modules 20, is not cooled by the cooling passage 61 and fins 64 (cooling zone).

Second Modification of First Embodiment

Figure 13:
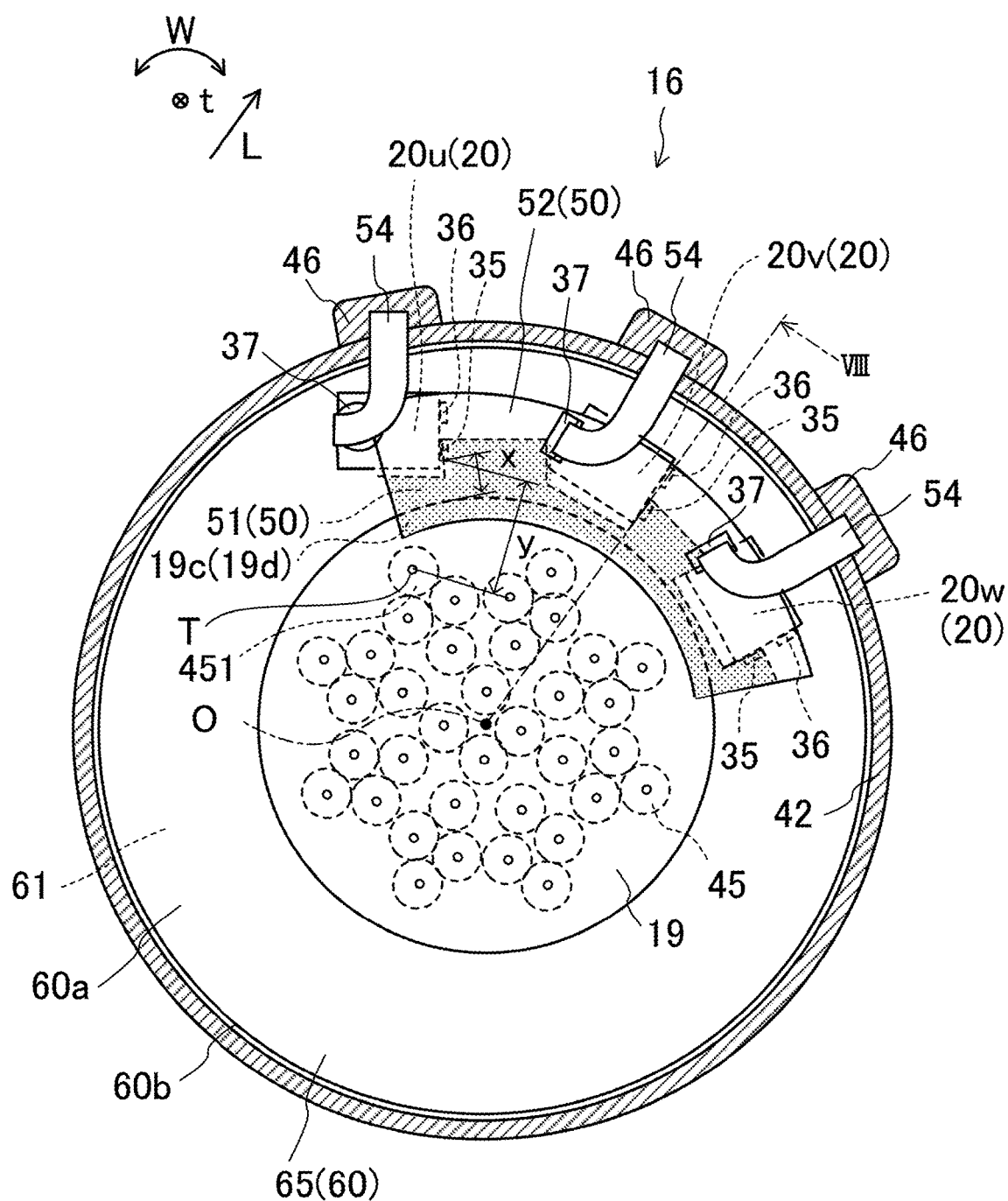
FIG. 13 is a horizontal cross-sectional view corresponding to FIG. 7 and illustrating the inverter, as viewed from the side opposite the motor, according to a second modification of the first embodiment.

FIG. 13 corresponds to FIG. 7 and illustrates a second modification of the first embodiment. The inverter 16 according to the present modification is disposed adjacent to the in-wheel motor 14 in the axial direction of the in-wheel motor 14 (or in the vehicle width direction) (see FIG. 1). The inverter 16 does not have the shaft through-hole 40 and the boss 41. In the smoothing capacitor 19, the unit capacitors 45 are also provided in and around the center. The heat sink 60 does not have the inner peripheral wall 60d. The cooling passage 61 is in the shape of a circle without a hole, as viewed in the axial direction of the motor 3.

Other Modifications of First Embodiment

The cooling medium H flowing in the cooling passage 61 may be, for example, air. The cooling zone may not include the cooling passage 61, and may be constituted by the fins 64 alone. The cooling zone may be constituted by a solid cooling member.

The cooling zone does not necessarily need to be provided throughout the perimeter, and may be provided only in an area facing toward the power modules 20 and extending in the circumferential direction.

Instead of the negative-side bus bar 51, the positive-side bus bar 52 may have the second cooled surface on one side thereof (or on one side in the thickness direction t) facing toward the motor 3 and mounted on the mounting surface 65.

While not shown, the output bus bars 54 may be wide members that extend along the circumferential direction of the motor 3. In other words, the width direction of the output bus bars 54 may be along the circumferential direction (or along an arc). The output bus bars 54 may be fan-shaped. This makes it easier to widen the output bus bars 54, and thus easier to reduce the inductances of the output bus bars 54 (see FIG. 10).

The mounting surface 65 may be constituted by a plurality of surfaces in the same plane orthogonal to the axial direction of the motor 3.

Second Embodiment

Figure 14:
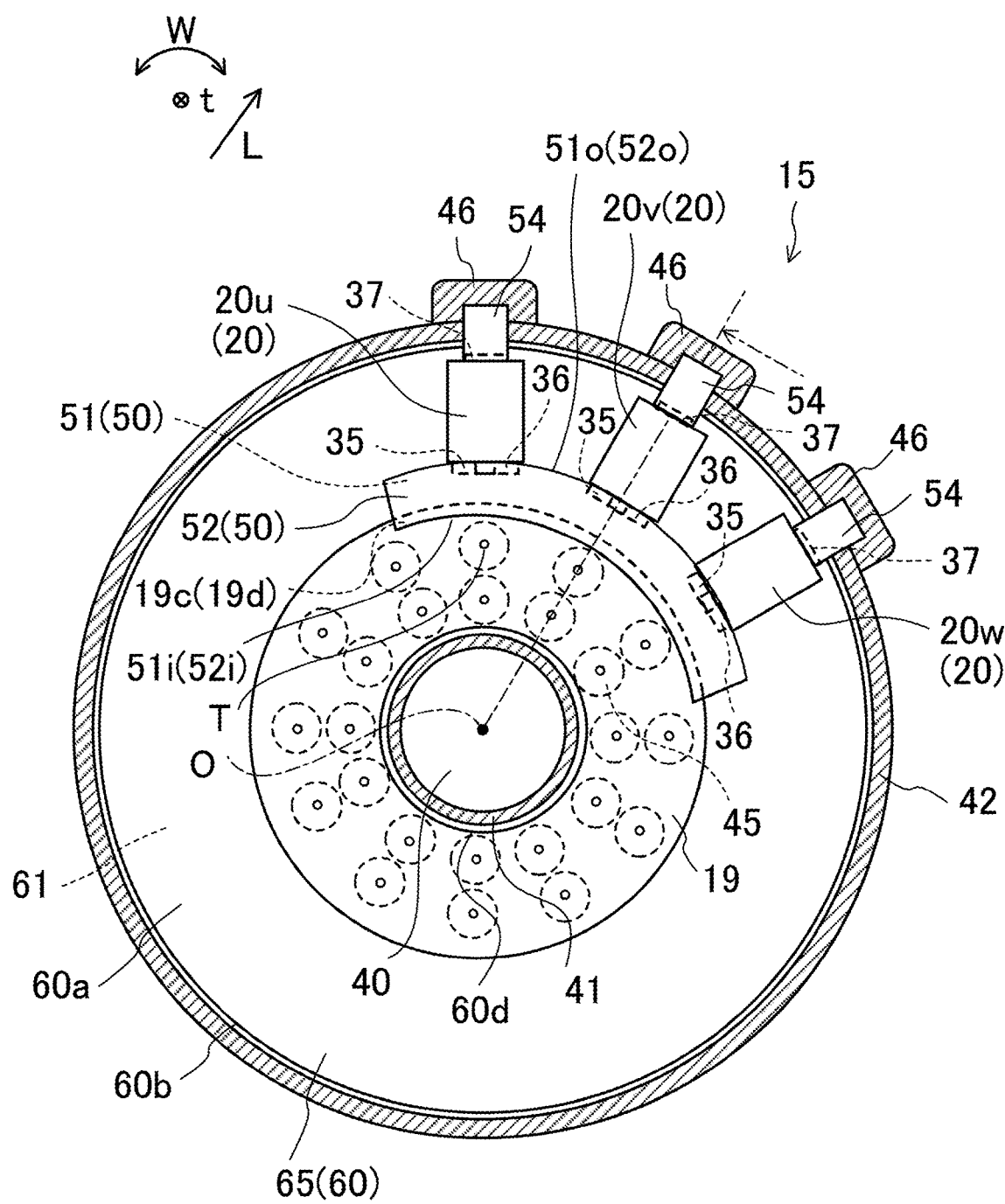
FIG. 14 is a horizontal cross-sectional view corresponding to FIG. 7 and illustrating the inverter, as viewed from the side opposite the motor, according to a second embodiment.
Figure 15:
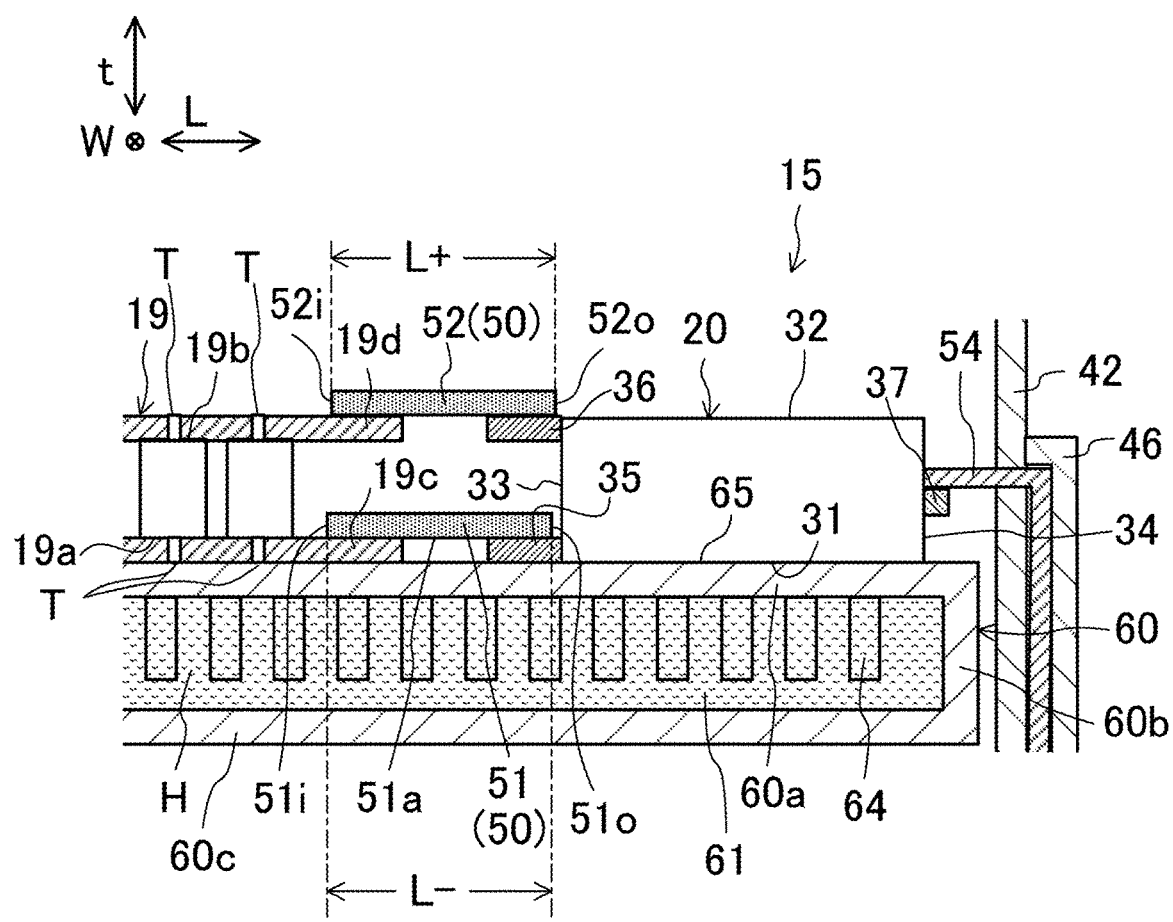
FIG. 15 is a vertical cross-sectional view corresponding to FIG. 8 and illustrating the inverter according to the second embodiment.

FIG. 14 is a horizontal cross-sectional view corresponding to FIG. 7 and illustrating the inverter 15, as viewed from the side opposite the motor 3, according to a second embodiment. FIG. 15 is a vertical cross-sectional view corresponding to FIG. 8 and illustrating the inverter 15 according to the second embodiment. Note that the same components as those of the aforementioned embodiment may not be described in detail.

In the present embodiment, the power modules 20 (U-phase power module 20u, V-phase power module 20v, and W-phase power module 20w) are arranged on the outer side of the smoothing capacitor 19. The power modules 20 are arranged side by side in the circumferential direction of the motor 3, on the outer side of the smoothing capacitor 19.

The input terminals 35 and 36 (on the first end face 33) and the output terminal 37 (on the second end face 34) of each power module 20 are configured to face in the radial direction of the motor 3 (inverter 15). Specifically, the input terminals 35 and 36 (on the first end face 33) of each power module 20 face inward, and the output terminal 37 (on the second end face 34) of each power module 20 faces outward. The power modules 20 are arranged on respective lines radially extending from the center O of the inverter 15 (motor 3).

As in the embodiments described above, the lower surface (first cooled surface) 31 of each power module 20 and the one-end-side bus plate (third cooled surface) 19c on the lower side of the smoothing capacitor 19 are mounted on the mounting surface 65.

As illustrated in FIG. 14, the width dimension of the negative-side bus bar 51 and the width dimension of the positive-side bus bar 52 are the same. As illustrated in FIG. 15, the length dimension L− of the negative-side bus bar 51 and the length dimension L+ of the positive-side bus bar 52 are the same. Accordingly, the inductance of the negative-side bus bar 51 and the inductance of the positive-side bus bar 52 are equal.

The other configurations are the same as those of the first embodiment.

Third Embodiment

Figure 16:
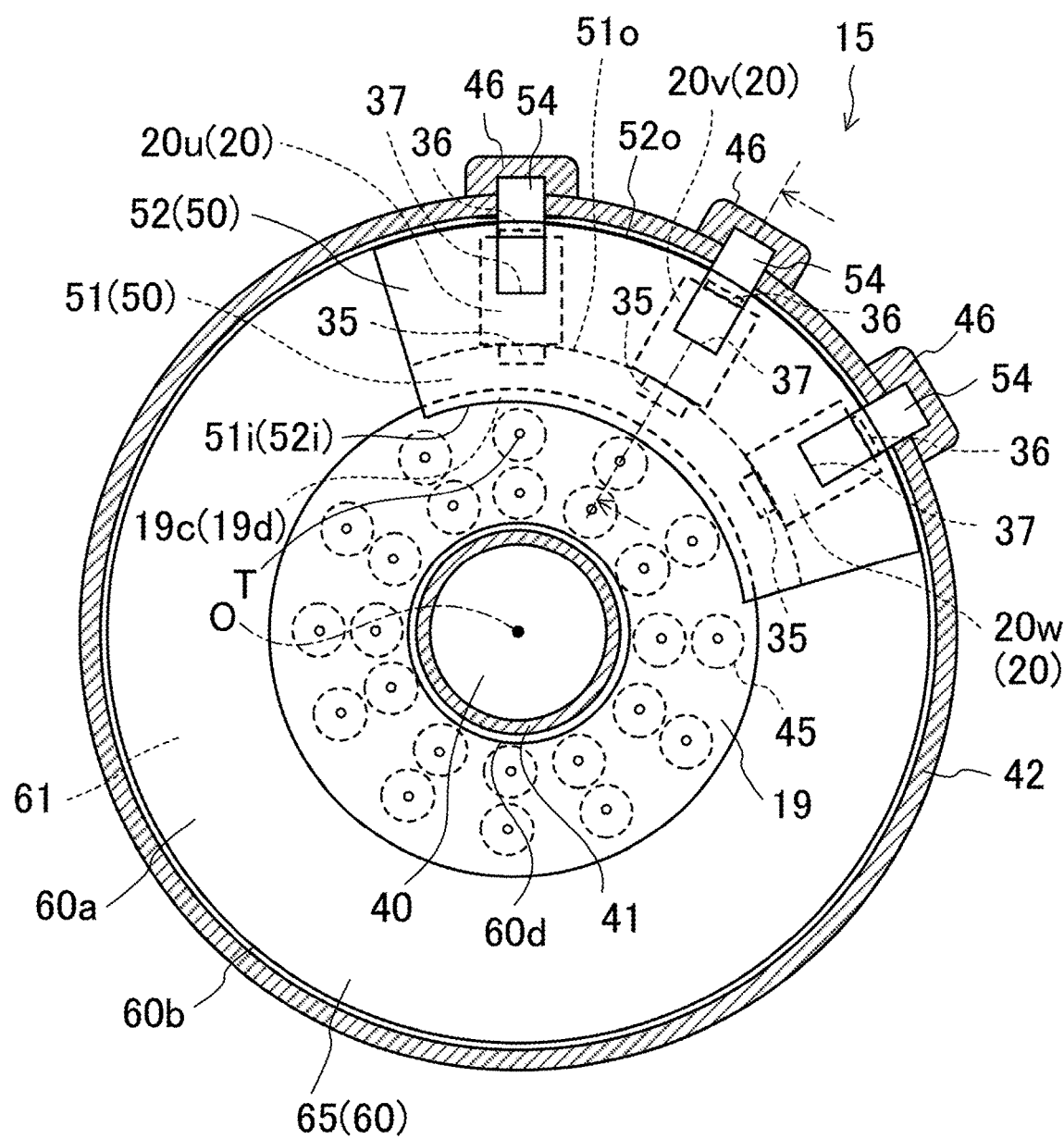
FIG. 16 is a horizontal cross-sectional view corresponding to FIG. 7 and illustrating the inverter, as viewed from the side opposite the motor, according to a third embodiment.
Figure 17:
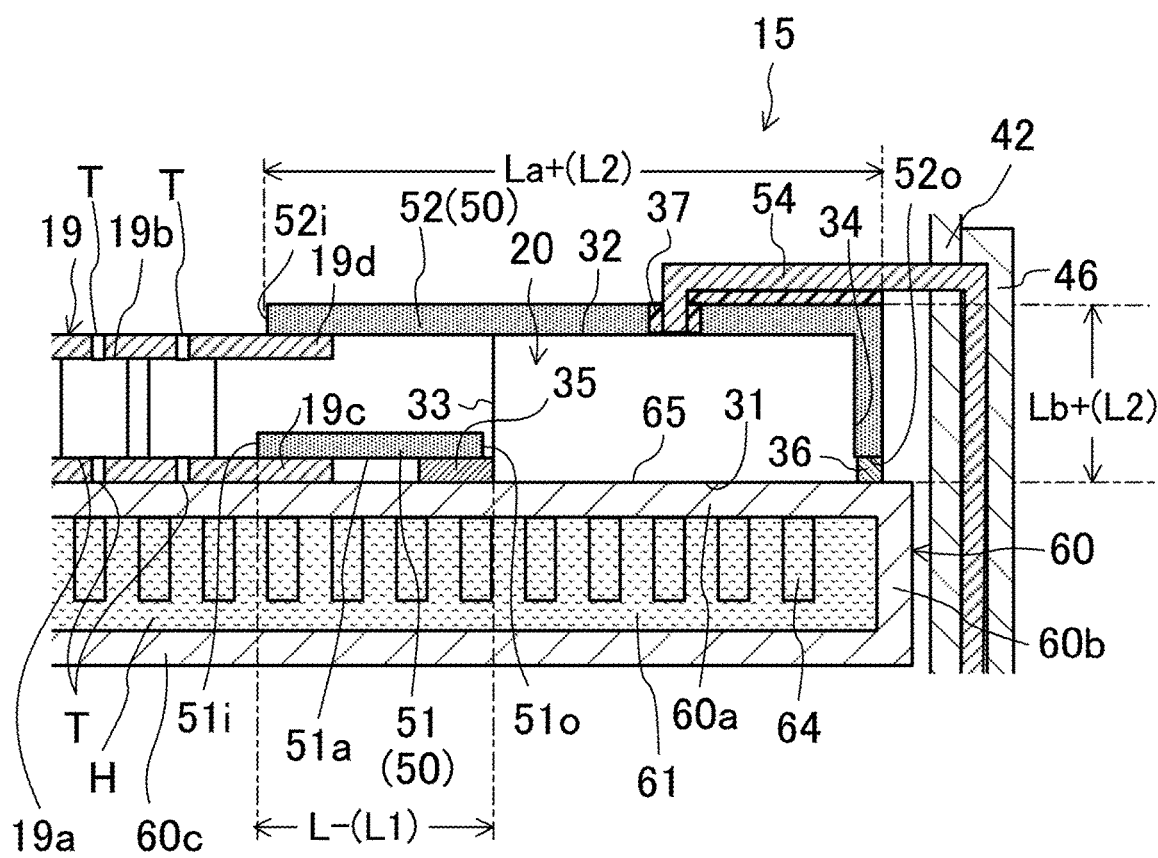
FIG. 17 is a vertical cross-sectional view corresponding to FIG. 8 and illustrating the inverter according to the third embodiment.

FIG. 16 is a horizontal cross-sectional view corresponding to FIG. 7 and illustrating the inverter 15, as viewed from the side opposite the motor 3, according to a third embodiment. FIG. 17 is a vertical cross-sectional view corresponding to FIG. 8 and illustrating the inverter 15 according to the third embodiment. Note that the same components as those of the aforementioned embodiments may not be described in detail.

As illustrated in FIGS. 16 and 17, the negative-side input terminal 35 is connected to the lower side of the first end face 33 of each power module 20. The positive-side input terminal 36 is connected to the lower side of the second end face 34 of each power module 20. The output terminal 37 is connected to the center of the upper surface 32 of each power module 20.

The negative-side bus bar 51 connects the one-end-side bus plate 19c of the smoothing capacitor 19 to the negative-side input terminal 35 of each power module 20. The positive-side bus bar 52 connects the other-end-side bus plate 19d of the smoothing capacitor 19 to the positive-side input terminal 36 of each power module 20.

The positive-side bus bar 52 leaves the other-end-side bus plate 19d of the smoothing capacitor 19 (one end portion 52i), and extends along the upper surface 32 from the first end face 33 toward the second end face 34 of each power module 20. The positive-side bus bar 52 then bends downward and extends along the second end face 34 to reach the positive-side input terminal 36 (the other end portion 52o) on the lower side. In other words, the positive-side bus bar 52 extends along the upper surface 32 to wrap the power module 20. Each output bus bar 54 leaves the output terminal 37 on the upper surface 32 of the power module 20 and extends upward. The positive-side bus bar 52 has three openings that allow passage of the respective output bus bars 54 that extend upward.

As in the embodiments described above, the lower surface (first cooled surface) 31 of each power module 20 and the one-end-side bus plate (third cooled surface) 19c on the lower side of the smoothing capacitor 19 are mounted on the mounting surface 65.

As illustrated in FIG. 16, the width dimension of the negative-side bus bar 51 and the width dimension of the positive-side bus bar 52 are the same. As illustrated in FIG. 17, the length dimension (L−) of the negative-side bus bar 51 and the length dimension (sum of La+ and Lb+) of the positive-side bus bar 52 differ from each other. The length dimension (L−) of the negative-side bus bar 51 corresponds to the first length L1. The length dimension (sum of La+ and Lb+) of the positive-side bus bar 52 corresponds to the second length L2. The length dimension (sum of La+ and Lb+, second length L2) of the positive-side bus bar 52 is longer than the length dimension (L−, first length L1) of the negative-side bus bar 51. Because of the presence of the local minimum M (see FIG. 10), however, the inductance of the negative-side bus bar 51 and the inductance of the positive-side bus bar 52 are equal.

The conditions (e.g., materials) of the negative-side bus bar 51 and the positive-side bus bar 52 according to the present embodiment differ from those in the embodiments described above. This means that the mode of the local minimum M (see FIG. 10) also differs from that in the embodiments described above. Specifically, the difference between the first length L1 and the second length L2 is greater than in the embodiments described above.

The other configurations are the same as those of the second embodiment.

Other Embodiments

Figure 18:
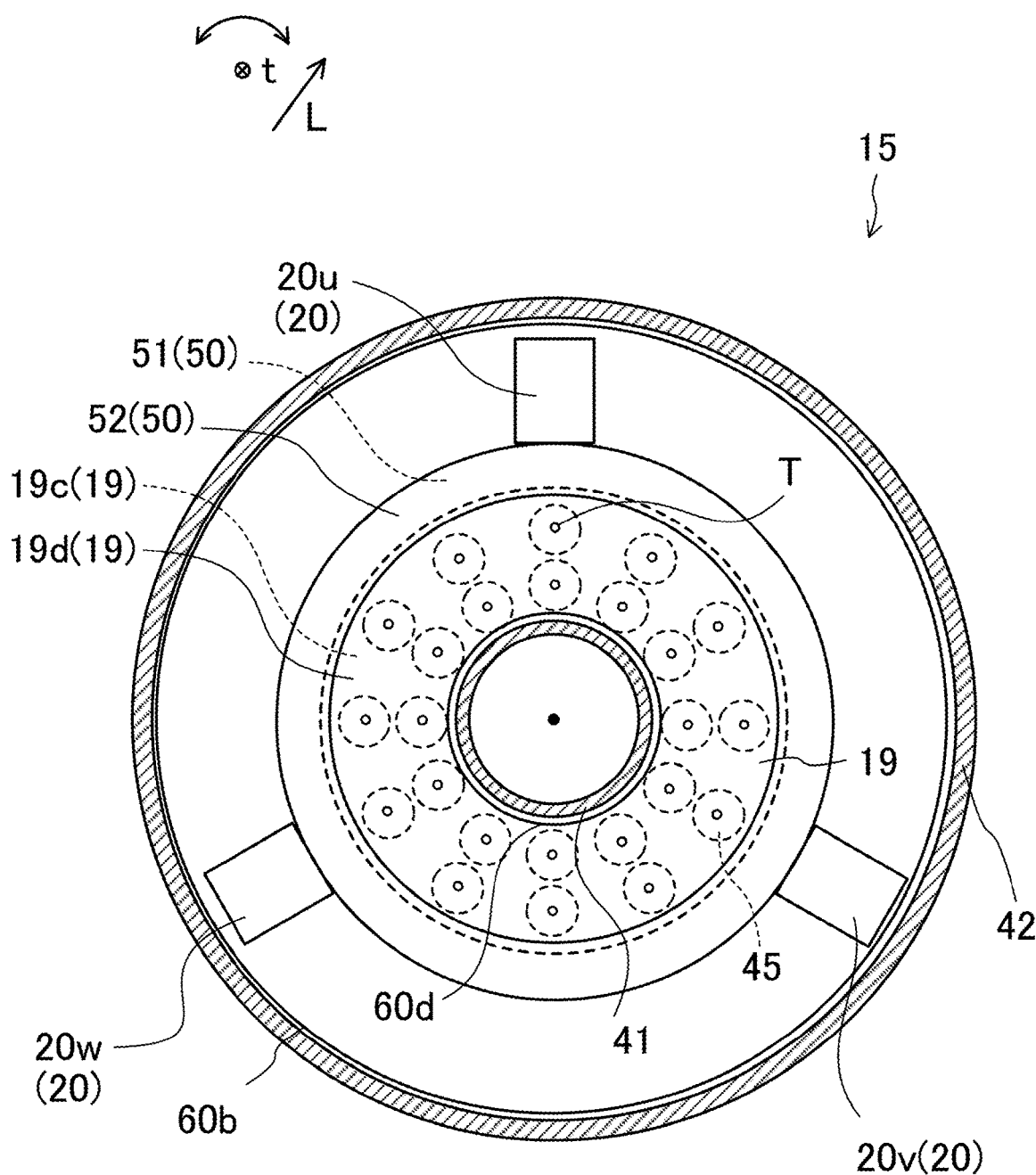
FIG. 18 is a schematic diagram illustrating an exemplary arrangement of power modules and unit capacitors according to another modification.

The embodiments described above show an example where three power modules 20 are closely arranged side by side on the circumference, but the arrangement of the power modules 20 is not limited to this. For example, as illustrated in FIG. 18, the power modules 20 may be arranged at intervals of 120° about the central axis, and the unit capacitors 45 may accordingly be arranged in a rotationally symmetrical pattern. This arrangement can further facilitate equalization of inductances.

Although the present disclosure has been described with reference to the preferred embodiments, the description above is not intended to be limiting and various modifications can be made.

What is claimed is:

1. An inverter structure of an inverter comprising a smoothing capacitor and a plurality of power modules,
   wherein the smoothing capacitor includes a plurality of columnar unit capacitors each having electrodes at both ends thereof, a plate-shaped one-end-side bus plate connected to the electrode at one end of each unit capacitor, and a plate-shaped other-end-side bus plate connected to the electrode at the other end of the unit capacitor, and the unit capacitors are arranged, with axes thereof parallel to each other, side by side in a direction along a plane perpendicular to the axes; and
   the power modules are arranged at positions equally distant from a predetermined center of the inverter and equally distant from the smoothing capacitor.

2. The inverter structure according to claim 1, wherein a pattern of arrangement of each power module and at least some unit capacitors close to the power module is set to be constant.

3. The inverter structure according to claim 2, wherein the one-end-side bus plate and the other-end-side bus plate are circular in outer shape.

4. The inverter structure according to claim 3, wherein the inverter further comprises an input bus bar configured to connect one of an outer edge of the one-end-side bus plate and an outer edge of the other-end-side bus plate to the power modules.

5. The inverter structure according to claim 4, wherein the outer edge of at least one of the one-end-side bus plate and the other-end-side bus plate is connected to the power modules.

6. The inverter structure according to claim 5, wherein an outer surface of at least one of the one-end-side bus plate and the other-end-side bus plate is disposed in the same plane as one of outer surfaces of the power modules.

7. The inverter structure according to claim 3, wherein an outer edge of at least one of the one-end-side bus plate and the other-end-side bus plate is connected to the power modules.

8. The inverter structure according to claim 3, wherein an outer surface of at least one of the one-end-side bus plate and the other-end-side bus plate is disposed in the same plane as one of outer surfaces of the power modules.

9. The inverter structure according to claim 7, wherein an outer surface of at least one of the one-end-side bus plate and the other-end-side bus plate is disposed in the same plane as one of outer surfaces of the power modules.

10. The inverter structure according to claim 2, wherein the inverter further comprises an input bus bar configured to connect one of an outer edge of the one-end-side bus plate and an outer edge of the other-end-side bus plate to the power modules.

11. The inverter structure according to claim 10, wherein an outer surface of at least one of the one-end-side bus plate and the other-end-side bus plate is disposed in the same plane as one of outer surfaces of the power modules.

12. The inverter structure according to claim 2, wherein an outer edge of at least one of the one-end-side bus plate and the other-end-side bus plate is connected to the power modules.

13. The inverter structure according to claim 12, wherein an outer surface of at least one of the one-end-side bus plate and the other-end-side bus plate is disposed in the same plane as one of outer surfaces of the power modules.

14. The inverter structure according to claim 2, wherein an outer surface of at least one of the one-end-side bus plate and the other-end-side bus plate is disposed in the same plane as one of outer surfaces of the power modules.

15. The inverter structure according to claim 1, wherein the one-end-side bus plate and the other-end-side bus plate are circular in outer shape.

16. The inverter structure according to claim 1, wherein the inverter further comprises an input bus bar configured to connect one of an outer edge of the one-end-side bus plate and an outer edge of the other-end-side bus plate to the power modules.

17. The inverter structure according to claim 16, wherein an outer surface of at least one of the one-end-side bus plate and the other-end-side bus plate is disposed in the same plane as one of outer surfaces of the power modules.

18. The inverter structure according to claim 1, wherein an outer edge of at least one of the one-end-side bus plate and the other-end-side bus plate is connected to the power modules.

19. The inverter structure according to claim 18, wherein an outer surface of at least one of the one-end-side bus plate and the other-end-side bus plate is disposed in the same plane as one of outer surfaces of the power modules.

20. The inverter structure according to claim 1, wherein an outer surface of at least one of the one-end-side bus plate and the other-end-side bus plate is disposed in the same plane as one of outer surfaces of the power modules.

* * * * *